(12) United States Patent
Liang et al.

(10) Patent No.: US 10,199,341 B2
(45) Date of Patent: Feb. 5, 2019

(54) SUBSTRATE STRUCTURE

(71) Applicant: Siliconware Precision Industries Co., Ltd., Taichung (TW)

(72) Inventors: Fang-Yu Liang, Taichung (TW);
Hung-Hsien Chang, Taichung (TW);
Yi-Che Lai, Taichung (TW);
Wen-Tsung Tseng, Taichung (TW);
Chen-Yu Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/224,767

(22) Filed: Aug. 1, 2016

(65) Prior Publication Data
US 2017/0317040 A1 Nov. 2, 2017

(30) Foreign Application Priority Data

Apr. 27, 2016 (TW) .............................. 105113075 A

(51) Int. Cl.
*H01L 23/00* (2006.01)
(52) U.S. Cl.
CPC .............. *H01L 24/05* (2013.01); *H01L 24/02* (2013.01); *H01L 24/13* (2013.01); *H01L 2224/0221* (2013.01); *H01L 2224/02205* (2013.01); *H01L 2224/02373* (2013.01); *H01L 2224/0401* (2013.01); *H01L 2224/05024* (2013.01); *H01L 2224/13026* (2013.01); *H01L 2924/3512* (2013.01); *H01L 2924/35121* (2013.01)

(58) Field of Classification Search
CPC ............. H01L 21/76898; H01L 23/481; H01L 2924/14; H01L 2924/12042; H01L 2224/0401; H01L 2224/05025; H01L 24/16; H01L 2924/01079; H01L 2924/09701; H01L 2924/3025; H01L 2224/13025; H01L 2924/01078; H01L 2224/401
See application file for complete search history.

(56) References Cited

U.S. PATENT DOCUMENTS

| | | | | |
|---|---|---|---|---|
| 2005/0029630 A1* | 2/2005 | Matsuo | ............. | H01L 21/30604 257/628 |
| 2007/0284729 A1* | 12/2007 | Kwon | ............... | H01L 21/76898 257/700 |
| 2009/0008790 A1* | 1/2009 | Lee | ........................ | H01L 23/481 257/774 |

* cited by examiner

*Primary Examiner* — Moazzam Hossain
*Assistant Examiner* — Stanetta Isaac
(74) *Attorney, Agent, or Firm* — Mintz Levin Cohn Ferris Glovsky and Popeo, P.C.; Peter F. Corless; Steven M. Jensen

(57) ABSTRACT

Provided is a substrate structure, including: a substrate body having a conductive contact; an insulating layer formed on the substrate body with the conductive contact exposed therefrom; and an insulating protection layer formed on a portion of a surface of the insulating layer, and having a plurality of openings corresponding to the conductive contact, wherein at least one of the openings is disposed at an outer periphery of the conductive contact. Accordingly, the insulating protection layer uses the openings to dissipate and disperse residual stresses in a manufacturing process of high operating temperatures.

10 Claims, 4 Drawing Sheets

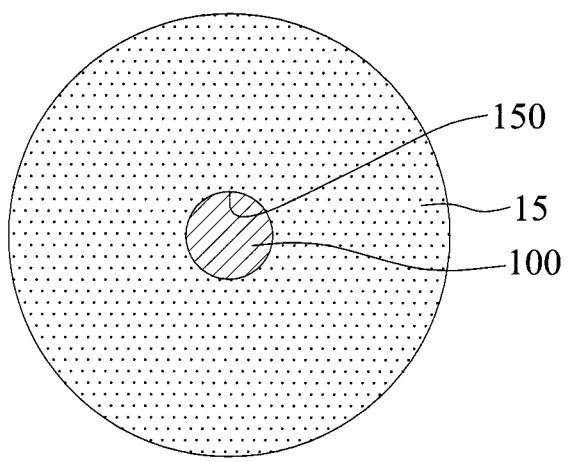
FIG. 1" (PRIOR ART)

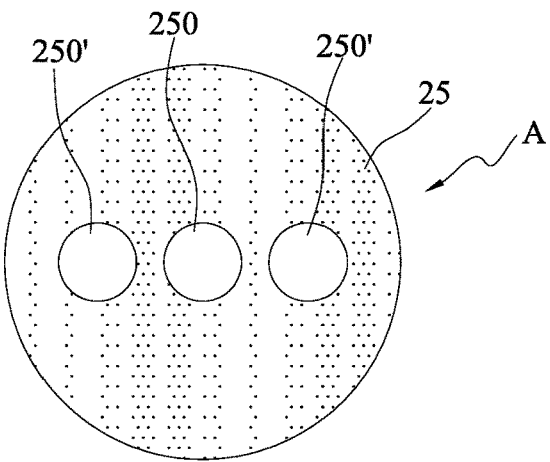
FIG.4
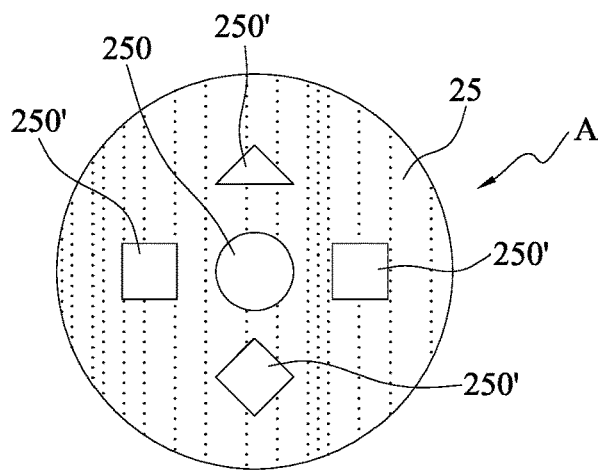
FIG.4'
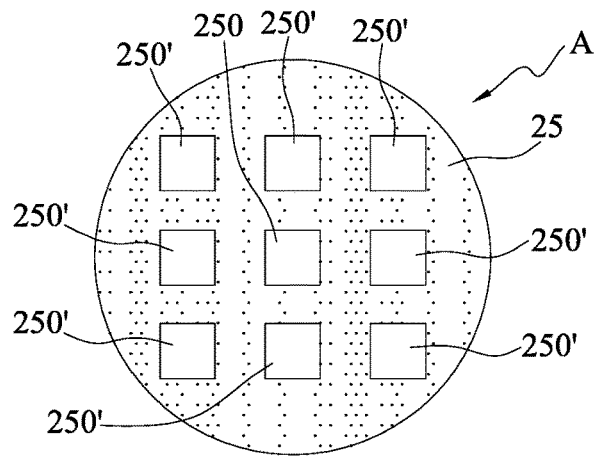
FIG.4"

SUBSTRATE STRUCTURE

CROSS-REFERENCE TO RELATED APPLICATION

This application claims under 35 U.S.C. § 119(a) the benefit of Taiwanese Patent Application No. 105113075 filed Apr. 27, 2016, the entire contents of which are incorporated herein by reference.

BACKGROUND

1. Technical Field

The present disclosure relates to substrate structures, and, more particularly, to a substrate structure with improved reliability and product yield.

2. Description of Related Art

Currently, many technologies have been used in the field of chip packages, including flip-chip package modules, such as chip scale package (CSP), direct chip attached (DCA), multi-chip module (MCM) and the like, and three dimensional integrated circuit (3D IC) chip stacking technologies by three-dimensionally stacking chips.

FIG. 1 is a sectional diagram of a conventional semiconductor package 1 fabricated by 3D IC chip stacking technology. The semiconductor package 1 has a through silicon interposer (TSI) 10, and the through silicon interposer 10 has a chip-mounting side 10b, a connection side 10a opposite to the chip-mounting side 10b, and a plurality of through-silicon vias (TSVs) 100 connecting the chip-mounting side 10b with the connection side 10a. A redistribution layer (RDL) 11 electrically connected with the through-silicon vias 100 is formed on the chip-mounting side 10b. Therefore, electrode pads 60 with smaller intervals on a semiconductor chip 6 are electrically connected onto the redistribution layer 11 by a plurality of solder bumps 61, and the solder bumps 61 are covered by an underfill 62. Soldering pads 70 with larger intervals on a packaged substrate 7 are electrically connected to the through silicon vias 100 by a plurality of conductive components 17 such as solder bumps. An encapsulant 8 is formed on the packaged substrate 7 and encapsulates the semiconductor chip 6.

Specifically, as shown in FIGS. 1' and 1" an insulating layer 12 is formed on the connection side 10a of the through silicon interposer 10, and has holes 120, with end surfaces of the through-silicon vias 100 exposed therefrom. An insulating protection layer 15 is formed on a portion of a surface of the insulating layer 12 (approximately around the holes 120 of the insulating layer 12), and has openings 150, from which the end surfaces of the through-silicon vias 100 are exposed. An under bump metal (UBM) 16 is formed on the end surfaces of the through-silicon vias 100 exposed from the holes 120 and the openings 150, and connected to the conductive component 17.

However, in the conventional semiconductor package 1 a residual stress generated by heat when the semiconductor package 1 is subject to a high temperature process (e.g., soldering the conductive component 17 to the soldering pads 70 by reflow soldering) will be concentrated at the interface between the conductive component 17 and the through-silicon vias 100, such as the stress concentration site k shown in FIG. 1', which causes the occurrence of peeling or crack between the insulating protection layer 15 and the under bump metal 16 (or between the insulating layer 12 and the through-silicon vias 100), thereby reducing the reliability and product yield of the semiconductor package 1.

Further, the same problem can take place on the solder bumps 61 between the semiconductor chip 6 and the redistribution layer 11, i.e., the stress concentration site k' as shown in FIG. 1, which causes the occurrence of peeling or crack between the solder bumps 61 and the redistribution layer 411.

Therefore, how to solve the problems in the prior art has become an urgent issue to be solved.

SUMMARY

In light of the disadvantages of the prior art, the present disclosure provides a substrate structure, comprising: a substrate body having at least one conductive contact; an insulating layer formed on the substrate body with the at least one conductive contact exposed therefrom; and an insulating protection layer formed on a portion of a surface of the insulating layer, and having a plurality of openings corresponding to the at least one conductive contact, wherein at least one of the openings is disposed at an outer periphery of the at least one conductive contact.

In an embodiment, the conductive contact is a conductive pillar or a conductive pad.

In an embodiment, a circuit layer is formed on the substrate body, and the insulating layer is formed on the circuit layer. In an embodiment, the conductive contact forms a portion of the circuit layer.

In an embodiment, at least one of the openings has a top view in a shape of a closed curve or a polygon.

In an embodiment, the substrate structure further comprises a metal layer formed in at least one of the openings. In another embodiment, the metal layer is in contact with the conductive contact.

In an embodiment, the substrate structure further comprises a conductive component disposed on the insulating protection layer.

In an embodiment, the insulating layer is exposed from at least one of the openings.

It can be seen from the above that in the substrate structure according to the present disclosure, the insulating protection layer has openings formed at an outer periphery of the conductive contact, such that a residual stress generated by heat can be decreased by the insulating protection layer when subjecting to high temperature progress such as reflow soldering. Compared with the prior art, the substrate structure according to the present disclosure can avoid the occurrence of peeling or crack between the insulating protection layer and the metal layer or between the insulating layer and the conductive contacts, and the reliability and product yield of the substrate structure are improved.

BRIEF DESCRIPTION OF THE DRAWINGS

FIG. 1' is a partially enlarged view of the semiconductor package of FIG. 1;

FIG. 1" is a partially top view of the semiconductor package of FIG. 1';

FIGS. 4, 4', and 4" are partially top views of different embodiments of FIG. 2A.

DETAILED DESCRIPTIONS

The implementation of the present disclosure will be illustrated by following particular embodiments. One skilled in the art can understand other advantages and effects from the content disclosed by the specification.

It should be understood, the structures, ratios, sizes, and the like in the accompanying figures are used for illustration of the content disclosed in the present specification to allow one skilled in the art to read and understand, rather than limiting the conditions for practicing the present disclosure, therefore, they have no technically essential meaning. Any modification of structure, alteration of ratio relationship, or adjustment of size without affecting the possible effects and achievable proposes should still fall in the range compressed by the technical content disclosed in the present specification. Meanwhile, terms such as "upper", "a", "an", and the like used herein are used for clear explanation only rather than limiting practical range by the present disclosure, thus, the alteration or adjustment of relative relationship without being supported by essentially altered technical content should be considered in the practical scope of the present disclosure.

Figure 1:
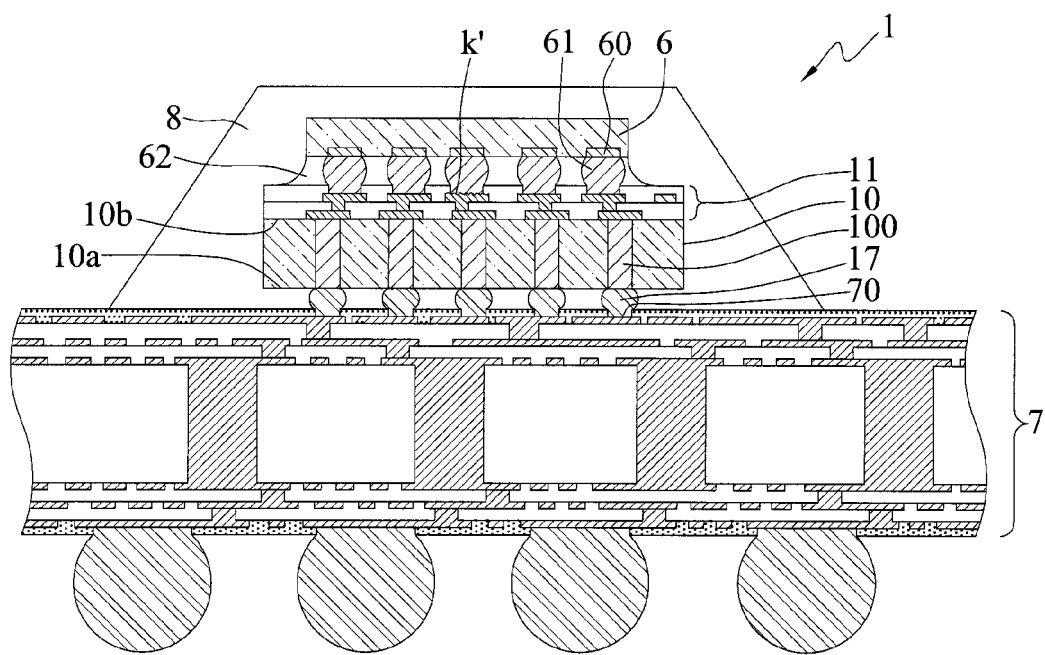
FIG. 1 is a sectional diagram of a conventional semiconductor package.
Figure 1:
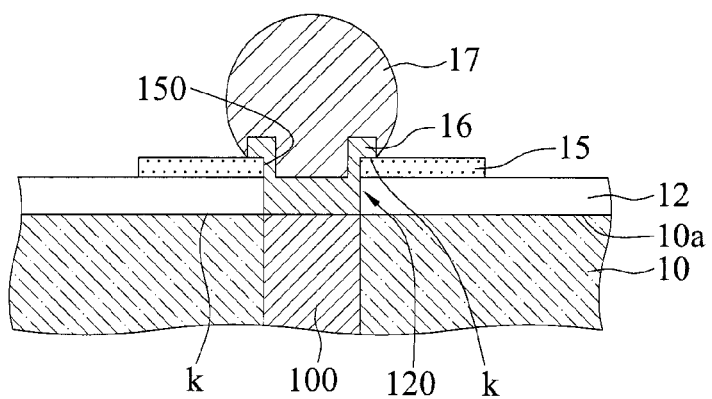
Figure 2A:
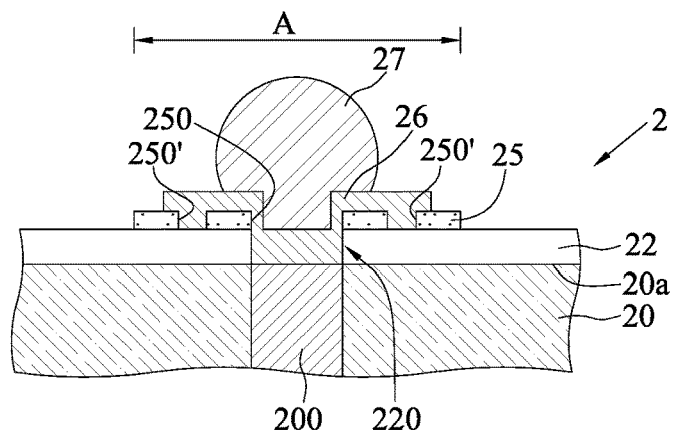
FIG. 2A is a sectional view of a substrate structure according to the present disclosure.

FIG. 2A is a sectional diagram of a substrate structure 2 according to the present disclosure. The substrate structure 2 includes a substrate body 20, an insulating layer 22, and an insulating protection layer 25.

The substrate body 20 has a surface 20a and at least one conductive contact 200 combined on the surface 20a. In an embodiment, the substrate body 20 is an insulating board, a metal board, or a semiconductor board, such as wafer, chip, silicon, glass, and the like. In another embodiment, the substrate body 20 is a through silicon interposer (TSI) or a glass substrate and has through-silicon via (TSV), and the conductive contact 200 is a conductive pillar.

Figure 2B:
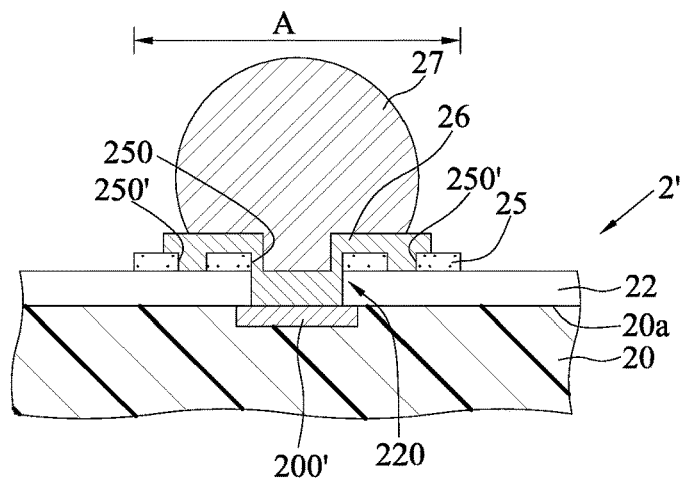
FIG. 2B is a sectional view of another embodiment of FIG. 2A.

In another embodiment, in the substrate structure 2' shown in FIG. 2B the substrate body 20 includes a circuit structure that has at least one dielectric layer and at least one circuit layer. In yet another embodiment, the conductive contact 200' is a conductive pad that is disposed on the outermost layer of the dielectric layers and is electrically connected to the circuit layer.

The insulating layer 22 is formed on a surface 20a of the substrate body 20 and has holes 220, from which the conductive contacts 200, 200' are exposed.

In an embodiment, the insulating layer 22 is an oxide layer or a nitride layer, such as silicon oxide ($SiO_2$) or silicon nitride ($Si_xN_y$).

The insulating layer 22 exposes each of the conductive contacts 200, 200' from each of the holes 220.

The insulating protection layer 25 is formed on a portion of a surface (i.e., around the holes 220) of the insulating layer 22, thus defining an insulating protection region A, and the insulating protection region A has a plurality of openings 250, 250' corresponding to the conductive contacts 200, 200'. In an embodiment, at least one of the openings 250' is disposed at an outer periphery of the conductive contact 200, 200'.

In an embodiment, the insulating protection layer 25 is made of an anti-soldering material or a dielectric material, such as polyimide (PI), benezocy-clobutene (BCB) and polybenzoxazole (PBO).

Further, as shown in FIG. 2A, the insulating protection layer 25 exposes each of the conductive contacts 200 by aligning a single opening 250 with the position of a single hole 220, while other openings 250' expose the insulating layer 22.

Also, as shown in FIGS. 4, 4' and 4", the top views of the openings 250, 250' are in the shape of closed curves (e.g., circle, oval) or polygons (e.g., rectangle, triangle, regular polygons or irregular polygons). It should be understood that the top views of the openings 250, 250' exposing the conductive contacts 200, 200' are preferably in the shape of circle, also can be rectangles as shown in FIG. 4", making the top view of the insulating protection layer 25 be in the form of palisade.

The substrate structure 2, 2' further comprises a metal layer 26 formed in the hole 210 and the openings 250, 250'. In an embodiment, the metal layer 26 contacts and electrically connects the conductive contacts 200, 200', and extends onto a portion of a surface of the insulating protection layer 25. In another embodiment, the metal layer 26 is formed in the plurality of openings 250, 250', and only the metal layer 26 in a single opening 250 contacts and electrically connects the conductive contacts 200, 200'.

In an embodiment, the metal layer 26 is under bump metal (UBM), can be made of, for example, Ti/Cu/Ni or Ti/NiV/cu, and can be patterned by sputter or plating operated with exposure and development. However, compositions and materials for the metal layer 26 are various and are not limited to foregoing.

The substrate structure 2, 2' further comprises at least one conductive component 27 disposed on the insulating protection layer 25. The conductive component 27 contacts and binds the metal layer 26 to allow an electronic device such as a semiconductor component, a packaged substrate and a circuit board to be combined with. In an embodiment, the conductive component 27 is a solder ball, metal bump, and the like, which allow the substrate structure 2, 2' to be combined with other electronic devices (not shown), such as a semiconductor wafer, a chip, an interposer having a through silicon via, a packaged substrate and a circuit board, by the conductive component 27.

Figure 3:
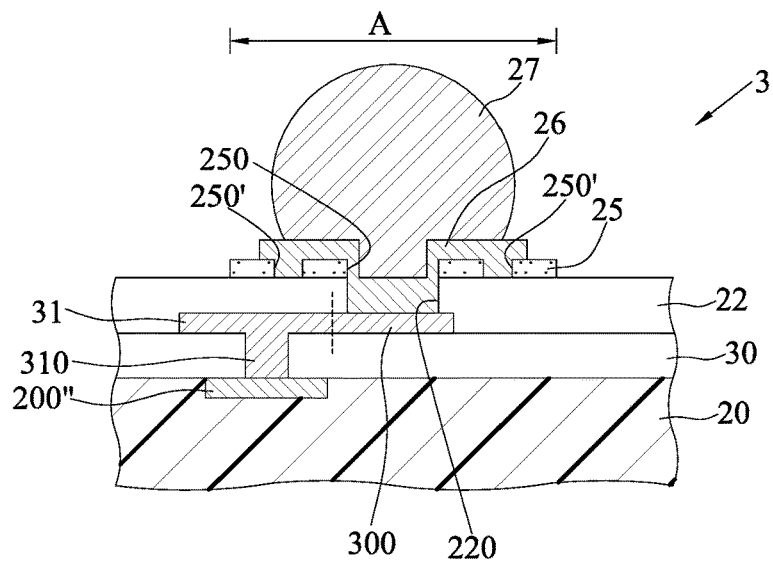
FIG. 3 is a sectional view of another embodiment of the substrate structure according to the present disclosure.

FIG. 3 is a sectional diagram of another embodiment of the substrate structure 3 according to the present disclosure. The substrate structure 3 differs from the substrate structure 2 in that the substrate structure 3 further comprises a circuit layer 31.

As shown in FIG. 3, the circuit layer 31 is formed on the substrate body 20, and the insulating layer 22 is formed on the circuit layer 31. In an embodiment, the circuit layer 31 has at least one conductive contact 300. In another embodiment, the substrate body 20 has a conductive pad 200", and a dielectric layer 30 exposing the conductive pad 200" therefrom is formed on the substrate body 20. The circuit layer 31 having the conductive contact 300 is formed on the dielectric layer 30 through a redistribution layer (RDL) process. The circuit layer 31 has at least one conductive via 310 formed in the dielectric layer 30 to electrically connect the conductive pad 200".

In an embodiment, the insulating layer 22 exposes each conductive contact 300 through each hole 220, and one of the openings 250 in the insulating protection layer 25 corresponds to the hole 220, with each of the conductive contacts 300 exposed therefrom.

The formation positions of the openings in the insulating protection layer and the formation position of the metal layer can be posited reference to an embodiment shown in FIG. 2B.

In the substrate structure 2, 2', 3 according to the present disclosure, by providing the insulating protection layer 25 with a plurality of openings 250, 250' formed at the outer periphery of the conductive contact 200, 200', 300, a residual stress generated by heat can be decreased by the insulating protection layer 25 when subjecting to high temperature progress (e.g., when soldering the conductive component 27 to the semiconductor chip or packaged substrate by reflow soldering). Compared with the prior art, the substrate structure 2, 2', 3 according to the present disclosure has a less stress concentrated at the interface between the conductive component 27 and the conductive contacts 200, 200', 300, and can thus avoid the occurrence of peeling or crack between the insulating protection layer 25 and the metal layer 26 or between the insulating layer 22 and the conductive contacts 200, 200', 300. Therefore, the reliability and product yield of the substrate structure according to the present disclosure are improved.

The foregoing Examples are used for the purpose of illustrating the mechanism and effects only rather than limiting the present disclosure. Anyone skilled in the art can modify and alter the above Examples without departing from the spirit and scope of the present disclosure. Therefore, the range claimed by the present disclosure should be listed in the range of the accompanying Claims.

What is claimed is:

1. A substrate structure, comprising:
   a substrate body having at least one conductive contact;
   an insulating layer formed on the substrate body, wherein the insulating layer has a lower surface, an upper surface corresponding to the lower surface, and a hole formed in the upper surface and exposing the at least one conductive contact; and
   an insulating protection layer formed only on a portion of the upper surface of the insulating layer and free from being formed on an inner wall and a bottom surface of the hole, wherein the insulating protection layer defines an insulating protection region corresponding to the at least one conductive contact, the insulating protection region has a plurality of openings, at least one of the openings corresponds to the at least one conductive contact, and at least one other of the openings is located on a periphery of the at least one conductive contact.

2. The substrate structure of claim 1, wherein the at least one conductive contact is a conductive pillar or a conductive pad.

3. The substrate structure of claim 1, further comprising a circuit layer formed on the substrate body.

4. The substrate structure of claim 3, wherein the insulating layer is formed on the circuit layer.

5. The substrate structure of claim 3, wherein the conductive contact forms a portion of the circuit layer.

6. The substrate structure of claim 1, wherein at least one of the openings has a top view in a shape of a closed curve or a polygon.

7. The substrate structure of claim 1, further comprising a metal layer formed in the at least one of the openings.

8. The substrate structure of claim 7, wherein the metal layer is in contact with the conductive contact.

9. The substrate structure of claim 1, further comprising a conductive component disposed on the insulating protection layer.

10. The substrate structure of claim 1, wherein the insulating layer is exposed from the at least one of the openings in the insulating protection region.

* * * * *